United States Patent
Nishimura et al.

(10) Patent No.: US 8,679,985 B2
(45) Date of Patent: Mar. 25, 2014

(54) DRY ETCHING METHOD FOR SILICON NITRIDE FILM

(75) Inventors: Eiichi Nishimura, Yamanashi (JP); Yusuke Shimizu, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 255 days.

(21) Appl. No.: 12/698,403

(22) Filed: Feb. 2, 2010

(65) Prior Publication Data

US 2010/0197143 A1  Aug. 5, 2010

Related U.S. Application Data

(60) Provisional application No. 61/224,109, filed on Jul. 9, 2009.

(30) Foreign Application Priority Data

Feb. 3, 2009 (JP) ................................. 2009-022611

(51) Int. Cl.
- *H01L 21/302* (2006.01)
- *H01L 21/461* (2006.01)
- *B44C 1/22* (2006.01)
- *C03C 25/68* (2006.01)
- *C03C 15/00* (2006.01)

(52) U.S. Cl.
USPC ........... 438/734; 438/706; 438/735; 438/744; 216/58; 216/72; 216/73; 216/74

(58) Field of Classification Search
USPC ........... 216/58, 72, 74, 79, 73; 438/706, 734, 438/735, 737, 738, 743, 744
See application file for complete search history.

(56) References Cited

U.S. PATENT DOCUMENTS

| | | | | |
|---|---|---|---|---|
| 4,749,440 A | * | 6/1988 | Blackwood et al. | 438/706 |
| 5,022,961 A | * | 6/1991 | Izumi et al. | 438/743 |
| 5,439,553 A | * | 8/1995 | Grant et al. | 216/58 |
| 2007/0039924 A1 | * | 2/2007 | Dip et al. | 216/79 |
| 2008/0179292 A1 | * | 7/2008 | Nishimura et al. | 216/79 |
| 2009/0149032 A1 | * | 6/2009 | Kameda et al. | 438/778 |

FOREIGN PATENT DOCUMENTS

| | | |
|---|---|---|
| JP | 05-041367 A | 2/1993 |
| JP | 2003-059915 A | 2/2003 |
| JP | 2003-264183 A | 9/2003 |
| JP | 2006-156700 A | 6/2006 |
| JP | 2008-187105 A | 8/2008 |

OTHER PUBLICATIONS

Ewell et al. "Azeotropic Distillation." Ind. Eng. Chem, 1944, 36(10), p. 871-875.*

* cited by examiner

*Primary Examiner* — Allan Olsen
*Assistant Examiner* — Margaret D Klunk
(74) *Attorney, Agent, or Firm* — Pearne & Gordon LLP

(57) ABSTRACT

A dry etching method for a silicon nitride film capable of improving throughput is provided. A dry etching method for dry-etching a silicon nitride film 103 includes dry-etching the silicon nitride film 103 without generating plasma by using a processing gas containing at least a hydrogen fluoride gas (HF gas) and a fluorine gas ($F_2$ gas), with respect to a processing target object 100 including the silicon nitride film 103.

8 Claims, 18 Drawing Sheets

REFERENCE EXAMPLE

REFERENCE EXAMPLE

DEPENDENCY BETWEEN STAGE TEMPERATURE AND E/R OF SILICON NITRIDE FILM

DEPENDENCY BETWEEN STAGE TEMPERATURE AND E/R OF SILICON OXIDE FILM

DEPENDENCY BETWEEN STAGE TEMPERATURE AND SELECTIVITY

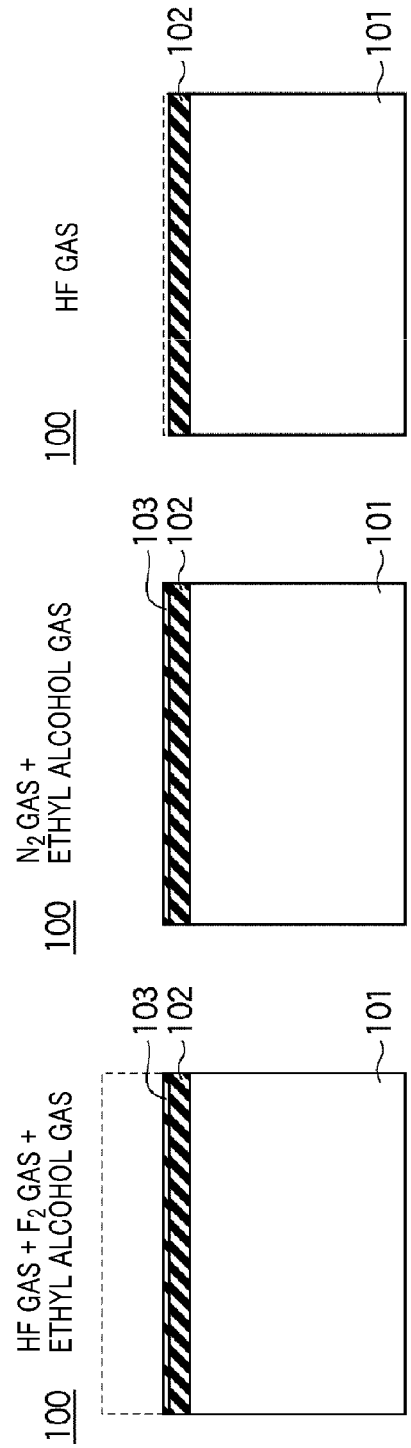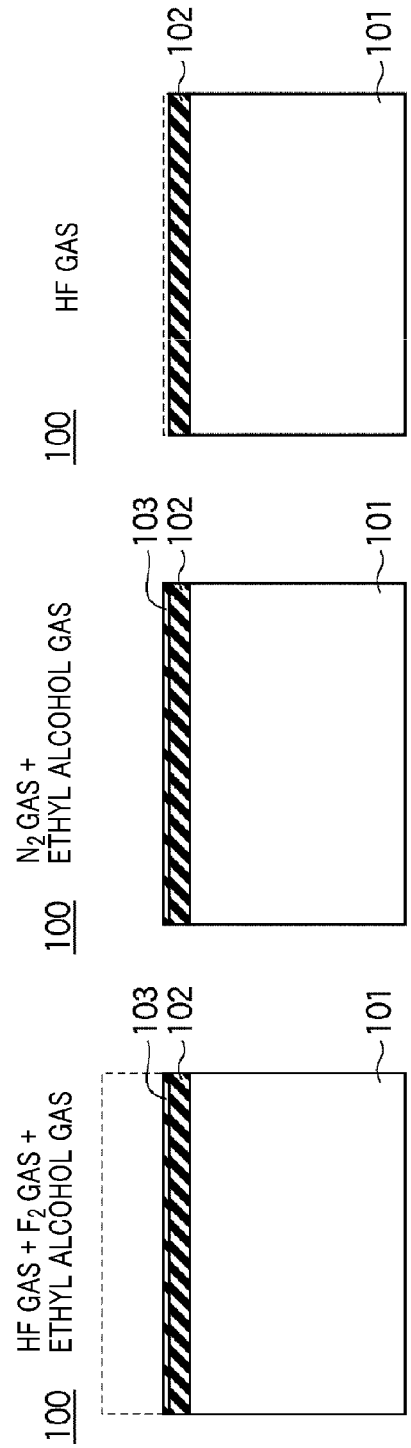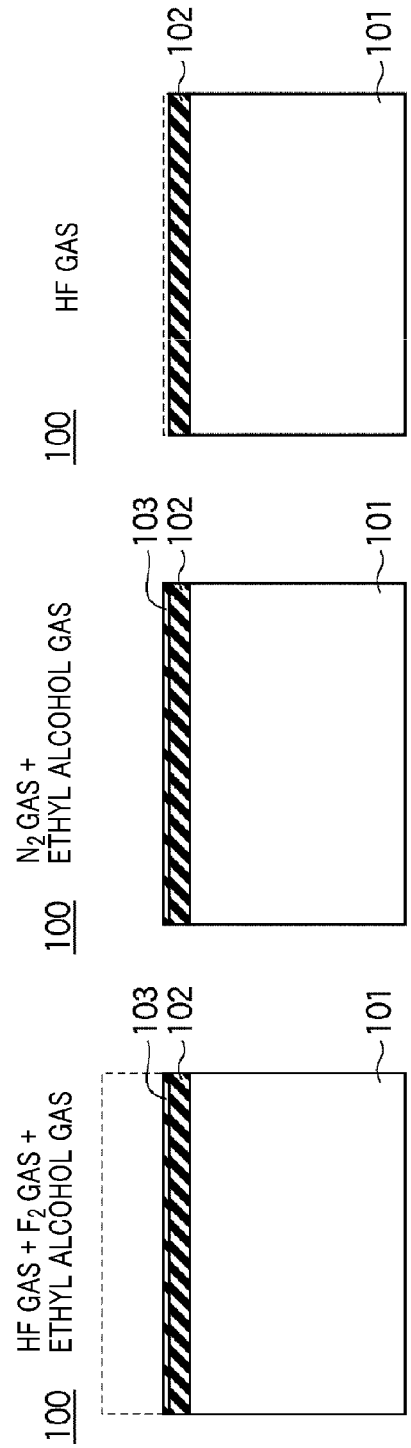

DRY ETCHING METHOD FOR SILICON NITRIDE FILM

CROSS-REFERENCE TO RELATED APPLICATION

This application claims the benefit of Japanese Patent Application No. 2009-022611, filed on Feb. 3, 2009 and U.S. Provisional Application Ser. No. 61/224,109 filed on Jul. 9, 2009, the entire disclosures of which are incorporated herein by reference.

FIELD OF THE INVENTION

The present disclosure relates to a dry etching method for a silicon nitride film; and, more particularly, to a dry etching method for a silicon nitride film without using plasma and to be used in an electronic device such as a semiconductor integrated circuit, a flat panel display or a solar cell substrate, or used in a manufacturing method thereof.

BACKGROUND OF THE INVENTION

As a processing target object having a thermal oxide film and a silicon nitride film (SiN) formed on the thermal oxide film, a semiconductor wafer is well-known. It may be required to etch and remove only the silicon nitride film from this semiconductor wafer without removing the thermal oxide film.

Known as an etching method for the silicon nitride film are plasma etching using plasma generated from a compound gas (see, for example, Patent Document 1) and wet etching using phosphoric acid, e.g., hot phosphoric acid (see, for example, Patent Document 2, paragraph [0042]).

In the plasma etching, however, it is difficult to achieve selectivity for the silicon nitride film against the thermal oxide film, so that damage on the thermal oxide film may be readily caused. Furthermore, since the plasma is used in the plasma etching, damage on the processing target object may be readily caused during the plasma etching.

On the other hand, the wet etching enables etching the silicon nitride film without inflicting damage on the target object because plasma is not used in this method. Furthermore, as compared to the plasma etching, the wet etching has an advantage in that the selectivity for the silicon nitride film against the thermal oxide film can be more readily achieved. In this method, however, management of an etching solution including management of liquid drain may be difficult.

As a solution, disclosed in Patent document 3 is a method for removing the silicon nitride film without causing damage on the thermal oxide film by way of dry-etching the silicon nitride film while using only a HF gas.

Patent Document 1: Japanese Patent Laid-open Publication No. 2003-264183
Patent Document 2: Japanese Patent Laid-open Publication No. 2006-156700
Patent Document 3: Japanese Patent Laid-open Publication No. 2008-187105

BRIEF SUMMARY OF THE INVENTION

However, the dry etching of the silicon nitride film using only the HF gas as disclosed in Patent Document 3 has a problem that an etching rate of the silicon nitride film is low and throughput may be deteriorated.

The present disclosure has been conceived to solve the above-stated problems, and provides a dry etching method for a silicon nitride film, capable of improving throughput.

In accordance with a first embodiment of the present disclosure, there is provided a dry etching method for dry-etching a silicon nitride film. The method dry-etches the silicon nitride film without generating plasma by using a processing gas containing at least a hydrogen fluoride gas and a fluorine gas, with respect to a processing target object including the silicon nitride film.

In accordance with a second embodiment of the present disclosure, there is provided a dry etching method for dry-etching a silicon nitride film formed on a silicon oxide film not containing phosphorous. The method includes a first process of dry-etching the silicon nitride film without generating plasma by supplying a processing gas, which contains at least a hydrogen fluoride gas and a fluorine gas, into a chamber until just-etching or almost just-etching of the silicon nitride film is achieved; and a second process of over-etching the silicon nitride film without generating plasma by changing an atmosphere within the chamber to an atmosphere of a processing gas containing only a hydrogen fluoride gas, after the first process.

In accordance with the present disclosure, a dry etching method for a silicon nitride film capable of improving throughput can be provided.

BRIEF DESCRIPTION OF THE DRAWINGS

The disclosure may be best understood by reference to the following description taken in conjunction with the following figures:

FIGS. 21A to 21C are cross sectional views illustrating a forth example of the dry etching method in accordance with the second embodiment of the present disclosure.

DETAILED DESCRIPTION OF THE INVENTION

Figure 1:
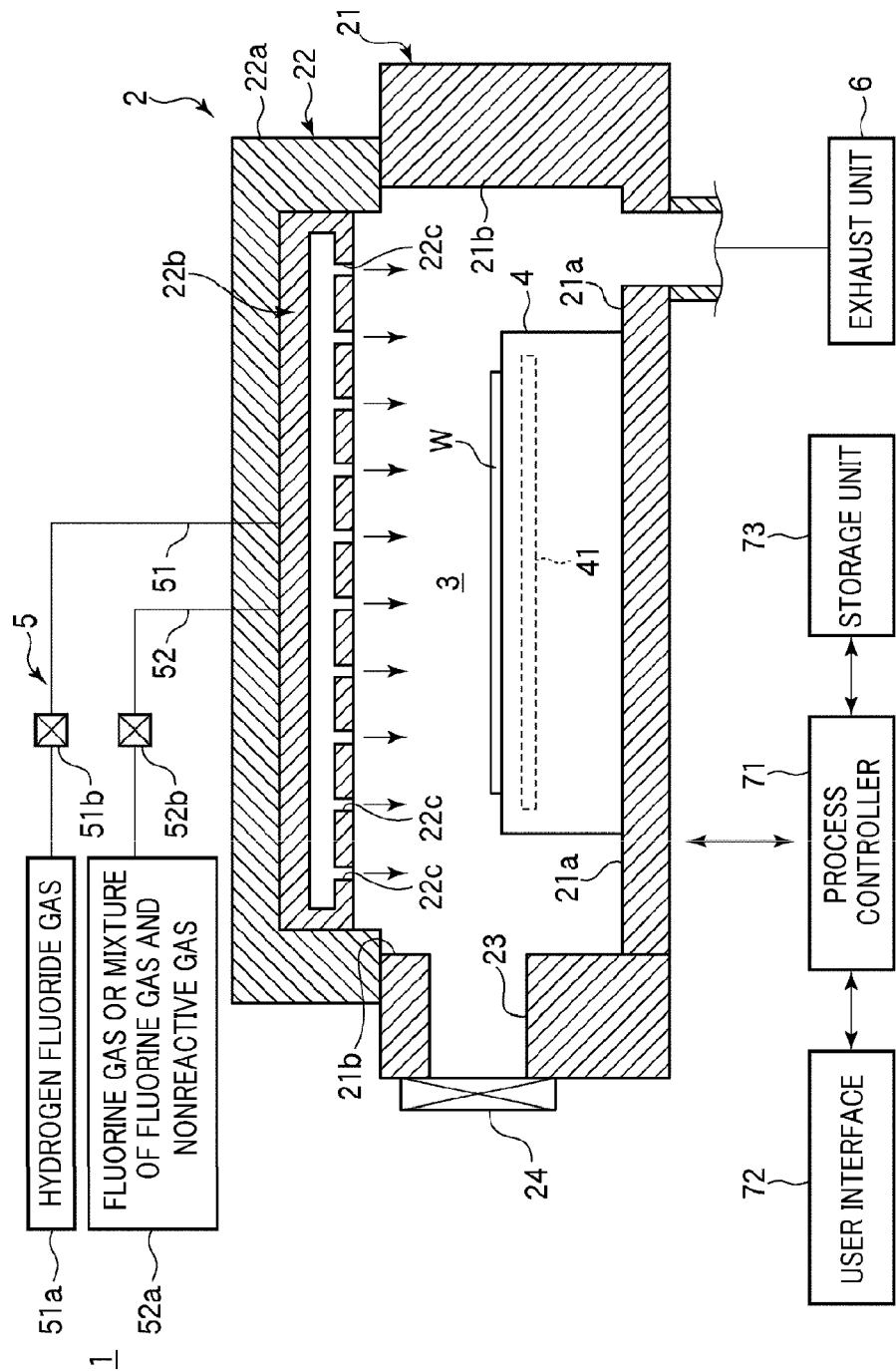
FIG. 1 is a cross sectional view of a dry etching apparatus used in a dry etching method for a silicon nitride film in accordance with a first embodiment of the present disclosure.

Hereinafter, embodiments of the present disclosure will be described with reference to the accompanying drawings. Through the whole document, same parts will be assigned same reference numerals.

First Embodiment

A first embodiment is described for the case of dry-etching a silicon nitride film formed on a semiconductor wafer (hereinafter, simply referred to as a wafer) as an example processing target object.

FIG. 1 is a cross sectional view schematically showing an example dry etching apparatus used in the dry etching method for the silicon nitride film in accordance with the first embodiment of the present disclosure.

As illustrated in FIG. 1, a dry etching apparatus 1 includes a hermetically sealed chamber 2. The inside of the chamber 2 is configured as a processing space 3 in which a wafer W as the example processing target object is accommodated. A stage 4 configured to mount the wafer W in a substantially horizontal manner is installed within the chamber 2. A gas supply unit 5 that supplies a processing gas into the chamber 2 and an exhaust unit 6 that evacuates the chamber 2 are installed outside the chamber 2.

In the present embodiment, the chamber 2 includes a chamber main body 21 and a cover 22. The chamber main body includes a bottom 21a and a substantially cylindrical sidewall 21b. A lower portion of the sidewall 21b is closed by the bottom 21a, and an upper portion of the sidewall 21b is opened. This opening is closed by the cover 22 fastened thereto. The sidewall 21b and the cover 22 are sealed by a non-illustrated sealing member, whereby the inside of the chamber 2 is maintained hermetically.

A loading/unloading port 23 through which the wafer W is loaded into and unloaded from the chamber 2 is provided in the sidewall 21b. A gate valve 24 is installed at the loading/unloading port 23, and the gate valve 24 opens and closes the loading/unloading port 23.

The cover 22 includes a cover main body 22a and a shower head 22b configured to discharge the processing gas. In the present embodiment, the shower head 22b is fixed to a lower portion of the cover main body 22a, and a bottom surface of the shower head 22b serves as an inner surface (bottom surface) of the cover 22. The shower head 22b serves as a ceiling of the chamber 2. The stage 4 is positioned under the shower head 22b, and the shower head 22b is configured to supply the processing gas toward the wafer W mounted on the stage 4 from the top. A plurality of discharge openings 22c through which the processing gas is discharged is opened in the entire bottom surface of the shower head 22b.

In the present embodiment, the stage 4 is fixed to the bottom 21a. The stage 4 has a circular or a substantially circular shape when viewed from the top, which is similar to the wafer W. A temperature controller 41 that controls the temperature of the stage 4 is installed within the stage 4. The temperature of the wafer W is controlled by adjusting the temperature of the stage 4.

In the present embodiment, the gas supply unit 5 includes a hydrogen fluoride gas supply line 51 for supplying a hydrogen fluoride gas (HF gas); and a fluorine gas supply line 52 for supplying a fluorine gas ($F_2$ gas) or a mixture of the fluorine gas and a nonreactive gas. The hydrogen fluoride gas supply line 51 and the fluorine gas supply line are connected to the shower head 22b. The hydrogen fluoride gas (HF gas), and the fluorine gas ($F_2$ gas) or the mixture of the fluorine gas and the nonreactive gas are discharged into the processing space 3 through the discharge openings 22c of the shower head 22b.

The hydrogen fluoride gas supply line 51 is connected to a hydrogen fluoride gas supply source 51a, and the fluorine gas supply line 52 is connected to a gas supply source 52a for supplying the fluorine gas or the mixture of the fluorine gas and the nonreactive gas. Provided on the hydrogen fluoride gas supply line 51 is a flow rate control valve 51b capable of opening and closing the gas supply line while controlling a flow rate of the hydrogen fluoride gas. Likewise, installed on the fluorine gas supply line 52 is a flow rate control valve 52b capable of opening and closing the gas supply line while controlling a flow rate of the fluorine gas or the mixture of the fluorine gas and the nonreactive gas.

The exhaust unit 6 includes a dry pump (not shown) or the like serving to evacuate the processing space 3, and is configured to control an internal pressure of the processing space 3 to a preset value by evacuating the chamber 2.

Each component of the dry etching apparatus 1 is connected to and controlled by a process controller 71 having a CPU. The process controller 71 is connected to a user interface 72 including a keyboard with which a process manager inputs a command in order to manage the dry etching apparatus 1, a display for visually showing an operational status of the dry etching apparatus 1, and the like.

Moreover, also connected to the process controller 71 is a storage unit 73 that stores therein control programs for executing the supply of the processing gas and the evacuation of the chamber 2 by the exhaust unit 6 during the dry etching process performed by the dry etching apparatus 1, and recipes including processing condition data and the like.

Upon receiving a command from the user interface 72, a necessary recipe is retrieved from the storage unit 73 and executed by the process controller 71. Accordingly, a desired process is performed in the dry etching apparatus 1 under the control of the process controller 71.

The recipes can be retrieved from a computer-readable storage medium such as a CD-ROM, a hard disk, a flexible disk, or a flash memory, or can be obtained by receiving from another apparatus via, e.g., a dedicated line, whenever necessary.

In the first embodiment, a silicon nitride film is dry-etched using a processing gas which is prepared by mixing a hydrogen fluoride gas (HF gas) with a fluorine gas ($F_2$ gas) or with a mixture of a fluorine gas and a nonreactive gas.

Figure 2A:
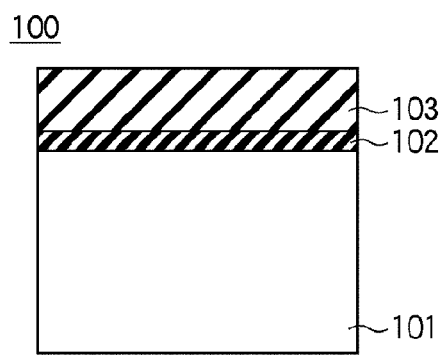
FIGS. 2A and 2B are cross sectional views illustrating an example of the dry etching method for a silicon nitride film in accordance with the first embodiment of the present disclosure.
Figure 2B:
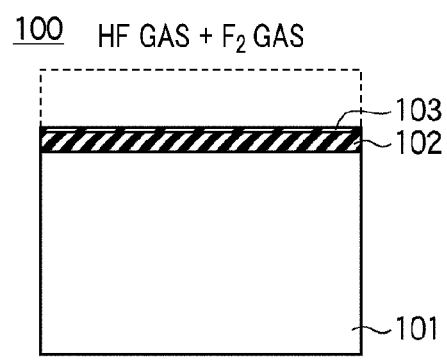

FIGS. 2A and 2B are cross sectional views illustrating an example dry etching method in accordance with the first embodiment of the present disclosure.

As illustrated in FIG. 2A, in the first embodiment, a sample 100 is used wherein a thermal oxide film 102 having a thickness of about 17 nm is formed on a silicon wafer 101 and a silicon nitride film 103 having a thickness of about 58 nm is formed on the thermal oxide film 102. Further, in this example, the silicon nitride film 103 is a LP—SiN formed by a low-pressure CVD method.

In the present example, the silicon nitride film of the sample 100 shown in FIG. 2A is dry-etched for about 140 seconds without generating plasma by using a processing gas prepared by mixing the hydrogen fluoride gas (HF gas) with the mixture of the fluorine gas ($F_2$ gas) and the nonreactive gas chosen between the fluorine gas ($F_2$ gas) and the mixture of the fluorine gas and the nonreactive gas. By the dry etching for about 140 seconds, just-etching or almost just-etching of the silicon nitride film 103 can be achieved, as shown in FIG. 2B.

Further, in the first embodiment, a nitrogen gas is used as the nonreactive gas, and a mixing ratio of the fluorine gas and the nitrogen gas is set to be about 20% (fluorine gas)/about 80% (nitrogen gas) (volume ratio). Although the nonreactive gas is used to dilute the fluorine gas, only the fluorine gas may be used without using the nonreactive gas.

Figure 3A:
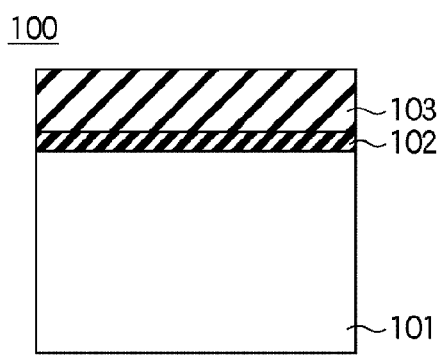
FIGS. 3A and 3B are cross sectional views illustrating a dry etching method for a silicon nitride film in accordance with a reference example.
Figure 3B:
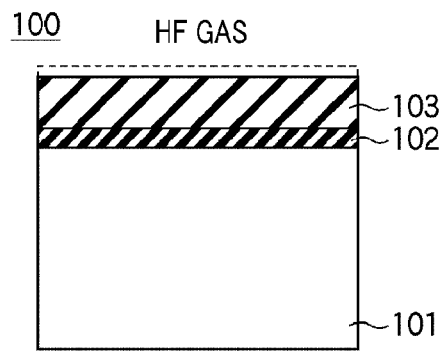

FIGS. 3A and 3B illustrate a dry etching method for a silicon nitride film in accordance with a reference example.

In the reference example, the same sample 100 as illustrated in FIG. 2A is used, as shown in FIG. 3A, and a silicon nitride film 103 of this sample 100 is dry-etched for about 140 seconds without generating plasma by using a processing gas containing only the hydrogen fluoride gas (HF gas). At this time, the other dry etching conditions are the same as those of the first embodiment. In this reference example, although the dry etching is performed for about 140 seconds, only about a half-etching of the silicon nitride film 103 may be achieved, as illustrated in FIG. 3B.

As can be seen from the above, the dry etching using the processing gas prepared by mixing the hydrogen fluoride gas (HF gas) with the fluorine gas ($F_2$ gas) or with the mixture of the fluorine gas and the nonreactive gas allows a higher etching rate of the silicon nitride film 103, as compared to the dry etching using only the hydrogen fluoride gas.

Accordingly, the dry etching method for the silicon nitride film in accordance with the first embodiment enables improvement of throughput.

Figure 4:
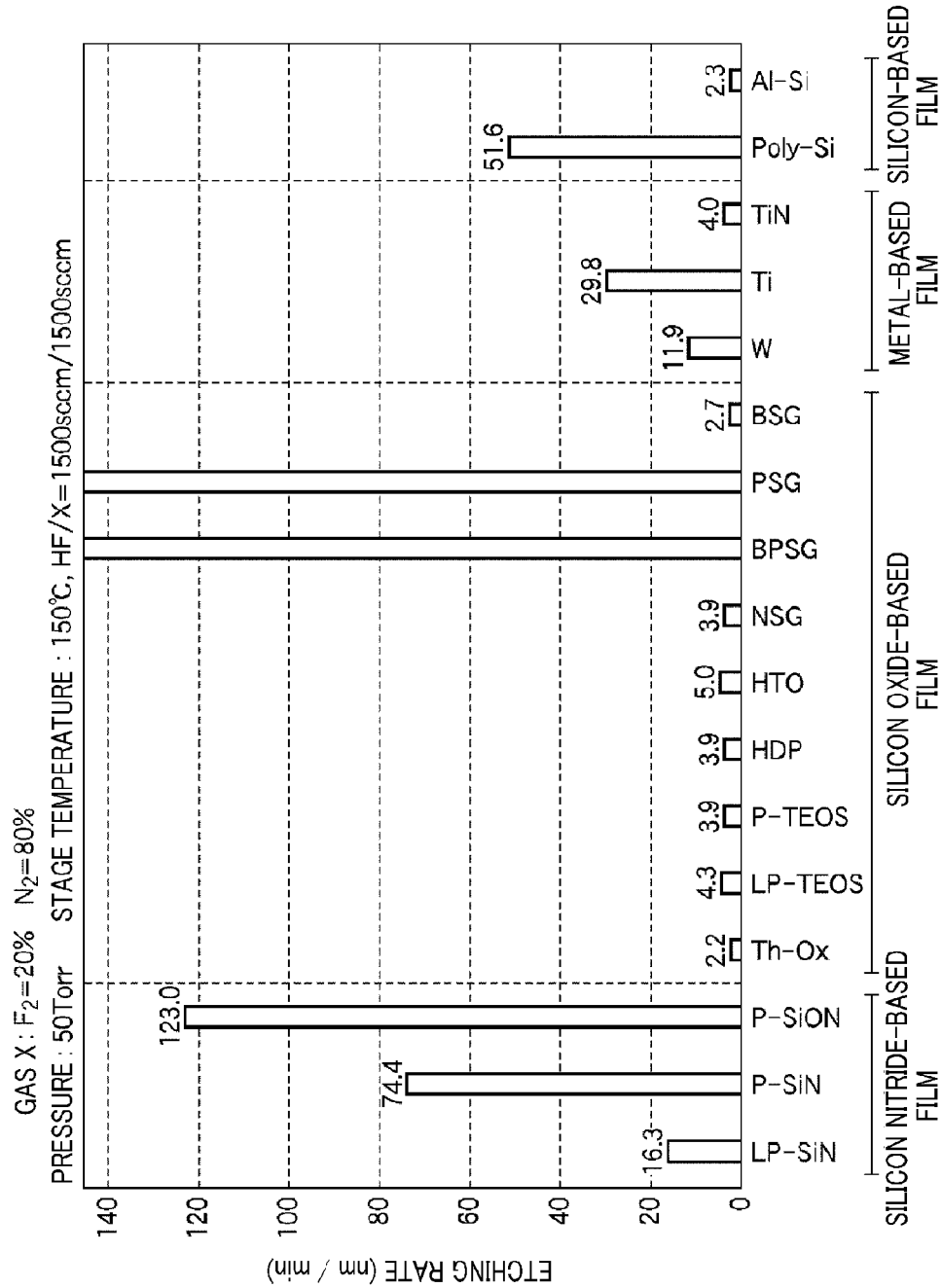
FIG. 4 is a diagram showing a thin film etching rate of a processing gas containing at least a hydrogen fluoride gas and a fluorine gas.

FIG. 4 shows a thin film etching rate of a processing gas containing at least a hydrogen fluoride gas (HF gas) and a fluorine gas ($F_2$ gas).

The etching rate shown in FIG. 4 was obtained by using a processing gas prepared by mixing the hydrogen fluoride gas with a mixture of the fluorine gas and a nonreactive gas (hereinafter, referred to as a gas mixture (X)). A flow rate ratio (HF/X) between the hydrogen fluoride gas and the gas mixture (X) was set to about 1500 sccm/1500 sccm. As for dry etching conditions, an internal pressure of the processing space 3 was set to be about 50 Torr, and a stage temperature was set to be about 150° C.

It can be seen from FIG. 4 that the dry etching using the processing gas containing at least the hydrogen fluoride gas and the fluorine gas exhibits a high etching rate for a silicon nitride-based film but a low etching rate for a silicon oxide-based film except for a silicon oxide film containing phosphorous (BPSG, PSG).

In FIG. 4, LP—SiN is a silicon nitride film formed by a low-pressure CVD method; P—SiN, a silicon nitride film formed by a plasma CVD method; P—SiON, a silicon oxynitride film formed by a plasma CVD method; Th-Ox, a thermal oxide film formed by thermal oxidation of single crystalline silicon; LP-TEOS, a silicon oxide film formed by a low-pressure CVD method while utilizing tetraethoxysilane (TEOS) as a source gas; P-TEOS, a silicon oxide film formed by a plasma CVD method while utilizing tetraethyoxysilane (TEOS) as a source gas; HDP, a silicon oxide film formed by a high-density plasma CVD method; HTO, a silicon oxide film formed by a high-temperature CVD method; NSG, non-doped silicate glass; BPSG, a boron-phosphorous containing silicate glass; PSG, phosphorous containing silicate glass; BSG, boron containing silicate glass; W, tungsten; Ti, titan; TiN, titan nitride; poly-Si, polycrystalline silicon; and Al—Si, aluminum silicon.

As can be seen from the result shown in FIG. 4, the dry etching method using the processing gas containing at least the hydrogen fluoride gas and the fluorine gas enables achieving high selectivity for the silicon nitride film against the silicon oxide film not containing phosphorous. Thus, dry etching of the silicon nitride film can be efficiently performed when a silicon oxide film not containing phosphorous is used as an etching stopper.

Accordingly, the dry etching method for the silicon nitride film in accordance with the first embodiment can be appropriately employed in etching a semiconductor wafer used in the manufacture of a semiconductor integrated circuit, or a glass substrate used in the manufacture of a flat panel display or a solar cell.

Figure 5:
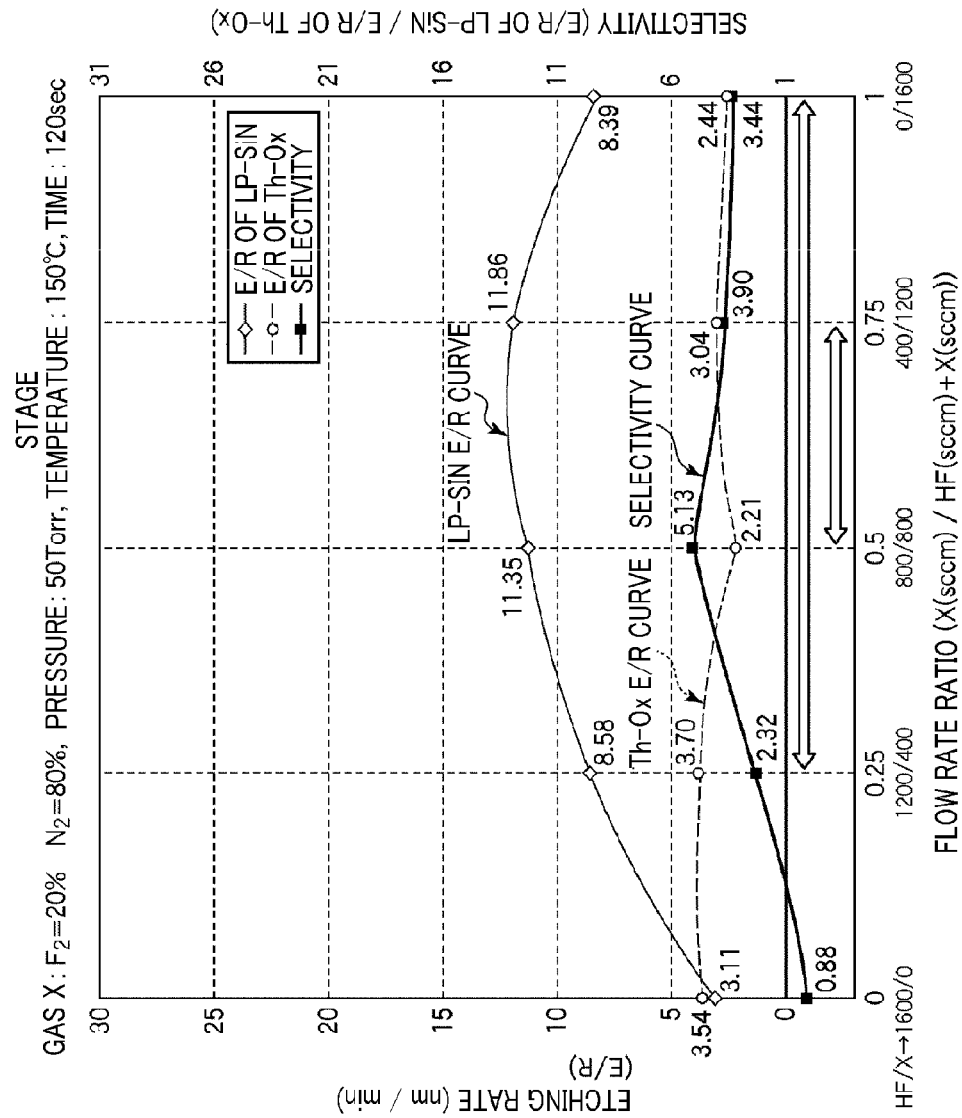
FIG. 5 is a diagram showing a relationship of a flow rate ratio between a hydrogen fluoride gas and a gas mixture (X), i.e., "X/(HF+X) or HF/X", etching rates of a silicon nitride film and a silicon oxide film, and their selectivity.

FIG. 5 shows a relationship of a flow rate ratio between the hydrogen fluoride gas and the gas mixture (X), i.e., "X(sccm)/(HF(sccm)+X(sccm)) or HF(sccm)/X(sccm)", etching rates of the silicon nitride film and the silicon oxide film, and their selectivity.

As for dry etching conditions in the example shown in FIG. 5, an internal pressure of the processing space 3 is about 50 Torr, and a stage temperature is about 150° C. Further, an etching time is about 120 seconds. The silicon nitride film is LP—SiN, and the silicon oxide film is Th-Ox.

As can be seen from FIG. 5, considering only the etching rate of the silicon nitride film, i.e., throughput improvement, it is desirable that the flow rate ratio is in the range of "$0.25 \leq X/(HF+X) \leq 1$" ("HF/X=1200/400~0/1600") because the etching rate exceeds about 8 nm/min in this range. Especially, a flow rate ratio range of "$0.5 \leq X/(HF+X) \leq 0.75$" ("HF/X=800/800~400/1200") is more desirable because the etching rate of the silicon nitride film exceeds about 11 nm/min in this range.

Moreover, the selectivity ("etching rate of the LP—SiN/ etching rate of Th-Ox") is maximized when the flow rate ratio is "X/(HF+X)=0.5 (HF/X=800/800)".

As shown in FIG. 5, when the silicon nitride film is dry-etched by the dry etching method for the silicon nitride film in accordance with the first embodiment while using the silicon oxide film not containing phosphorous as the etching stopper, the flow rate ratio range of "$0.25 \leq X/(HF+X) \leq 1$" is desirable, and the flow rate ratio range of "$0.5 \leq X/(HF+X) \leq 0.75$" is more desirable.

Second Embodiment

A silicon nitride film (e.g., LP—SiN) is dry-etched using a processing gas containing at least a hydrogen fluoride gas and a fluorine gas when a base is silicon (silicon wafer) and a silicon oxide film (e.g., a thermal oxide film (Th-Ox)) is used as an etching stopper.

Further, overetching is performed to completely remove the silicon nitride film from the entire surface of the silicon wafer.

However, the base silicon was observed to be roughened when the silicon nitride film was over-etched. The present inventors have conjectured the reason for the roughness as follows.

The silicon nitride film does not only contain silicon and nitrogen but it also contains a very small amount of oxygen as well. The very small amount of oxygen forms $SiO_2$ locally in the silicon nitride film. If the silicon nitride film having the locally-formed $SiO_2$ is etched using the processing gas containing at least the hydrogen fluoride gas and the fluorine gas, water ($H_2O$) is generated, as indicated by a reaction formula (1).

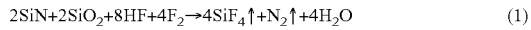
$2SiN+2SiO_2+8HF+4F_2 \rightarrow 4SiF_4\uparrow+N_2\uparrow+4H_2O$ (1)

Further, the fluorine gas reacts with the water, whereby hydrofluoric acid (HF(aq)) and an oxygen gas ($O_2$) are generated, as indicated by a reaction formula (2) as follows.

$2F_2+2H_2O \rightarrow 4HF(aq)+O_2\uparrow$ (2)

That is to say, as compared to the dry etching using only the hydrogen fluoride gas, hydrofluoric acid is generated because the fluorine gas is added. The hydrofluoric acid etches the thermal oxide film ($SiO_2$) as indicated by a reaction formula (3).

$SiO_2+4HF(aq) \rightarrow SiF_4\uparrow+2H_2O$ (3)

The thermal oxide film is an etching stopper. If the etching on the etching stopper progresses, the base silicon is exposed. With the processing gas containing at least the hydrogen fluoride gas and the fluorine gas, an etching rate of the silicon is higher than an etching rate of the thermal oxide film, as shown in FIG. 4.

Figure 6A:
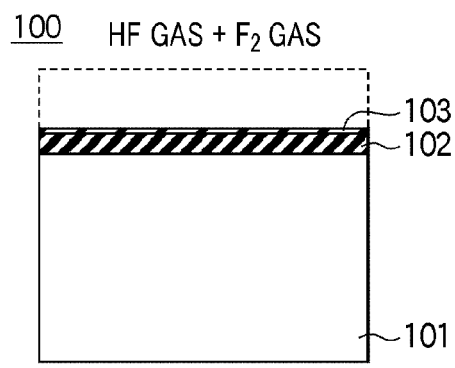
FIGS. 6A and 6B are diagrams illustrating roughening of a base that occurs during an overetching process.
Figure 6B:
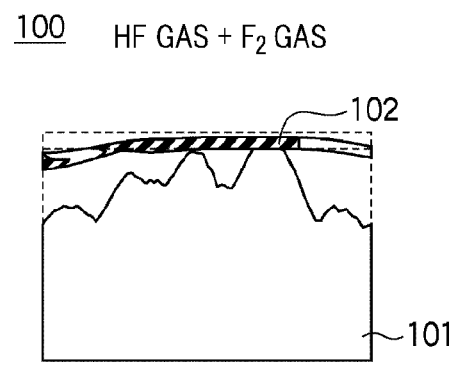

For the reason, if overetching is performed from the just-etching or almost just-etching state of the silicon nitride film 103, as shown in FIG. 6A, the thermal oxide film 102 as the etching stopper would be etched during the overetching, resulting in exposure of the base silicon 101, as illustrated in FIG. 6B. The exposed silicon 101 would be etched as well, and, thus, the base silicon 101 would be roughened.

In this regard, a second embodiment provides an etching method for a silicon nitride film capable of suppressing roughness of a base in a dry etching process using a processing gas containing at least a hydrogen fluoride gas and a fluorine gas.

First Example

Figure 7A:
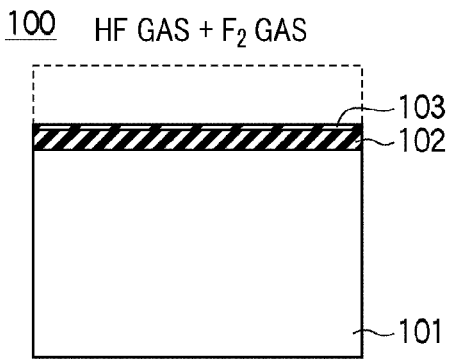
FIGS. 7A and 7B are cross sectional views illustrating a first example of a dry etching method in accordance with a second embodiment of the present disclosure.
Figure 7B:
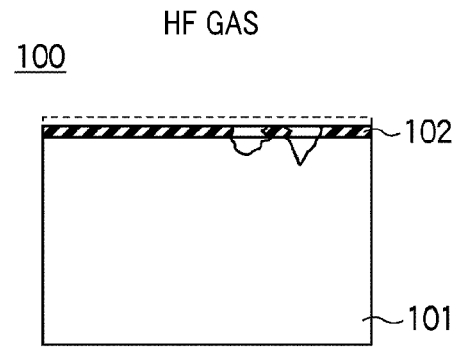

FIGS. 7A and 7B are cross sectional views illustrating a first example of the dry etching method in accordance with the second embodiment of the present disclosure.

As illustrated in FIG. 7A, in the first example, dry etching is performed using a processing gas containing at least a hydrogen fluoride gas and a fluorine gas until just-etching or almost just-etching of the silicon nitride film 103 is achieved. Example conditions for this dry etching process are as follows. An internal pressure of the processing space 3 is about 50 Torr; a flow rate ratio (HF/X) between the hydrogen fluoride gas and the gas mixture (X) is about 1500 sccm/1500 sccm; a stage temperature is about 150° C.; and an etching time is about 140 seconds.

Then, subsequent overetching is performed by dry etching using only a HF gas, as shown in FIG. 7B. Example dry etching conditions for the overetching are as follows. The hydrogen fluoride gas (HF) is about 1500 sccm; a stage temperature is about 150° C.; and an etching time is about 180 seconds.

In accordance with this first example, since a fluorine gas is not used in the overetching, generation of hydrofluoric acid (HF(aq)) can be suppressed.

As discussed, in accordance with the dry etching method for the silicon nitride film in accordance with the first example of the second embodiment, by performing the overetching by dry etching using only the hydrogen fluoride gas, roughness of the base can be suppressed as compared to the case of performing the overetching by using the processing gas containing at least the hydrogen fluoride gas and the fluorine gas.

Second Example

In the above-described first example, roughness of the base can be suppressed by performing the overetching by the dry etching using only the hydrogen fluoride gas. From this result, water ($H_2O$) staying on the sample (processing target object) and the fluorine gas or the gas mixture (X) containing the fluorine gas and the nonreactive gas are inferred to cause the roughness of the base.

Based on such an inference, in a second example, a research has been additionally conducted to remove the water and the fluorine gas or the gas mixture (X) from the sample (processing target object).

Figure 8:
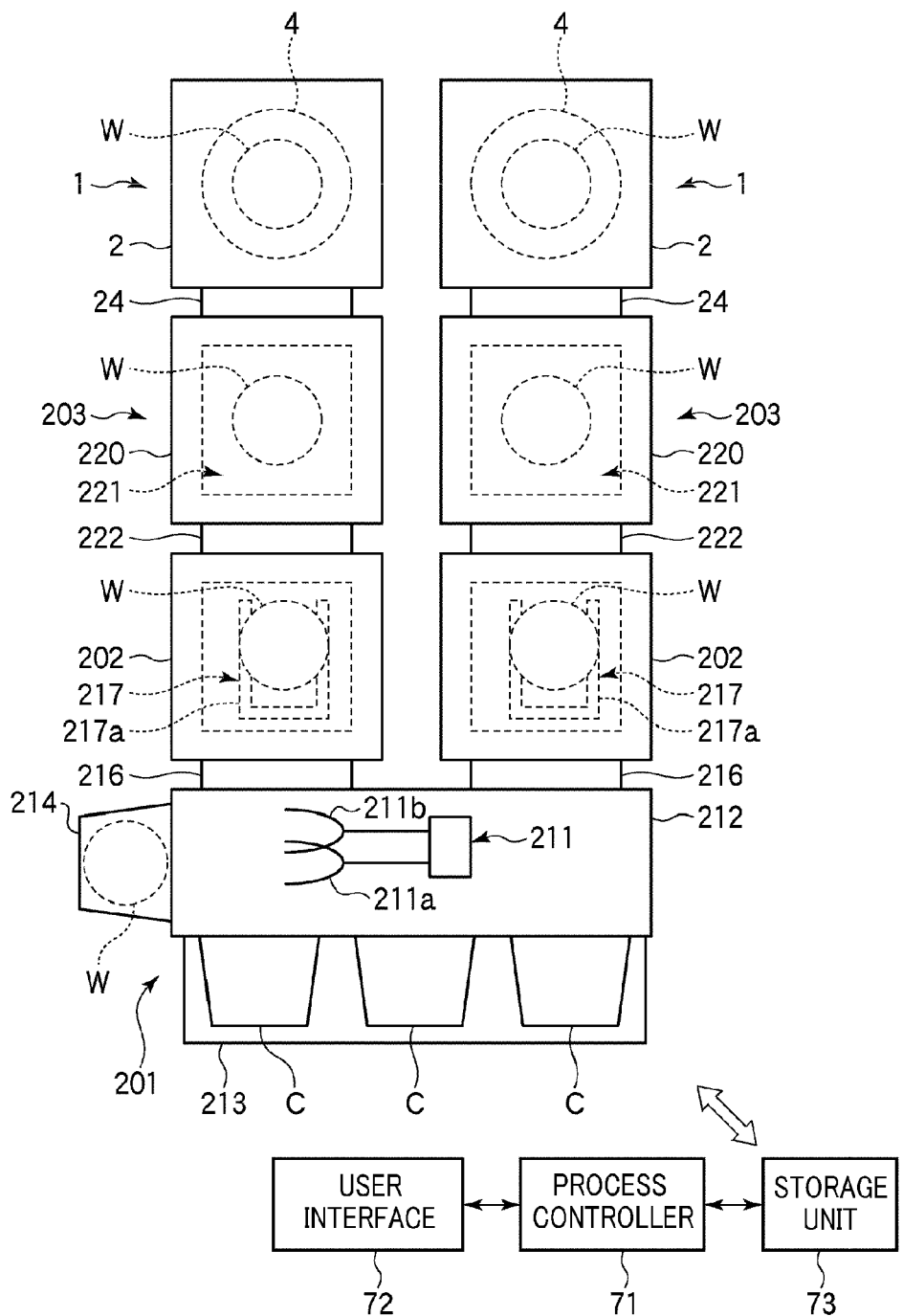
FIG. 8 is a plane view schematically illustrating an example dry etching system used in a dry etching method for a silicon nitride film in accordance with a second example of the second embodiment of the present disclosure.

FIG. 8 is a plane view schematically illustrating an example dry etching system used in a dry etching method for a silicon nitride film in accordance with the second example of the second embodiment of the present disclosure.

As illustrated in FIG. 8, the dry etching system 200 includes a loading/unloading unit 201 for loading and unloading wafers W into/from the system 200; two load lock chambers (L/L) 202 installed adjacent to the loading/unloading unit 201; heat treating apparatuses 203 installed adjacent to the load lock chambers 202, respectively, for performing heat treatment on the wafers W; and dry etching apparatuses 1 installed adjacent to the heat treating apparatuses 203, respectively, for dry-etching the wafers W. For example, each dry etching apparatus 1 is the same as the dry etching apparatus described in FIG. 1. The heat treating apparatuses 203 and the dry etching apparatuses 1 are aligned on the same straight line in parallel to each other in this sequence from the load lock chambers 202.

The loading/unloading unit 201 includes a transfer chamber (L/M) 212 having therein a first wafer transfer mechanism 211 which is configured to transfer the wafers W having, e.g., a circular shape when viewed from the top. The wafer transfer mechanism 211 includes two transfer arms 211a and 211b configured to hold the wafers W in a substantially horizontal manner. A mounting table 213 is installed at one side of the transfer chamber 212 in a lengthwise direction, and, e.g., three carriers C, each capable of accommodating therein a plurality of wafers W in parallel, are provided on the mounting table 213. Further, installed adjacent to the transfer chamber 212 is an orienter 214 that adjusts a position of each wafer W by rotating the wafer W and optically detecting an eccentric amount thereof.

In the loading/unloading unit 201, the wafers W are held by the transfer arms 211a and 211b and are transferred to desired positions by being moved straight on a substantially horizontal plane and elevated up and down by the wafer transfer mechanism 211. As the transfer arms 211a and 211b move forward and backward with respect to the carriers C on the mounting table 213, the orienter 214 and the load lock chambers 202, the wafers are loaded into or unloaded from there.

The load lock chambers 202 are connected with the transfer chamber 212 via respective gate valves 216 provided between the load lock chambers 202 and the transfer chamber 212. A second wafer transfer mechanism 217 configured to transfer the wafer W is installed in each of the load lock chambers 202, and the wafer transfer mechanism 217 has a transfer arm 217a configured to hold the wafer W in a substantially horizontal manner. The load lock chambers 202 can be evacuated to a preset vacuum level.

In each load lock chamber 202, the transfer arm 217a holds the wafer W and rotates and moves it straight on the substantially horizontal plane and elevates it up and down by being driven by the wafer transfer mechanism 217 so as to transfer the wafer W. As such transfer arms 217a move forward and backward with respect to the heat treating apparatuses 203 respectively coupled to the load lock chambers 202, the wafers W are loaded and unloaded into/from the heat treating apparatuses 203. Further, as the transfer arms 217a move forward and backward into/from the dry etching apparatuses 1 via the heat treating apparatuses 203, respectively, the wafers W are loaded and unloaded into/from the dry etching apparatuses 1.

Each heat treating apparatus 203 includes a processing space 221 provided within a hermetically sealed chamber 220 configured to accommodate the wafer W therein. The chamber 220 is provided with a non-illustrated loading/unloading port through which the wafer W is loaded into or unloaded from the processing space 221, and the loading/unloading port is opened and closed by the gate valve 222. The chambers 220 are connected with the load lock chambers 202 via respective gate valves 222 provided between the chambers 220 and the load lock chambers 202.

Figure 9:
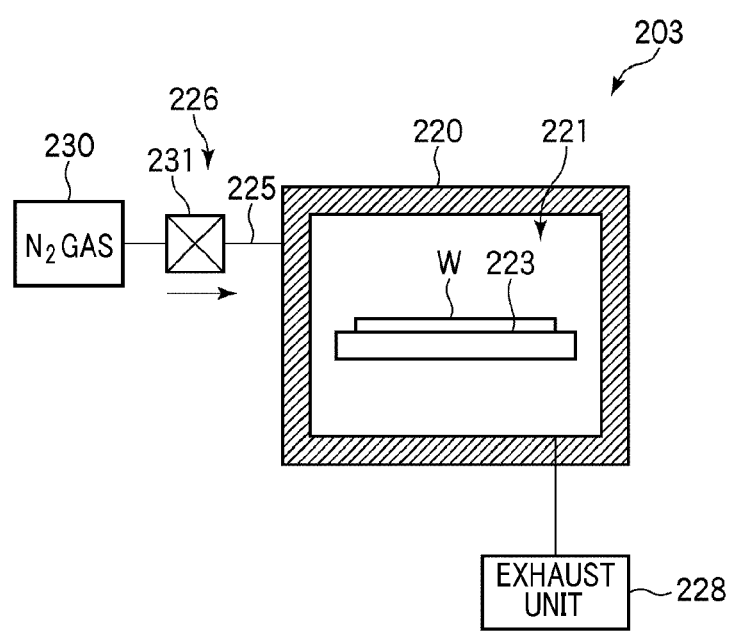
FIG. 9 is a cross sectional view illustrating a heat treating apparatus 203 shown in FIG. 8.

FIG. 9 is a cross sectional view schematically illustrating the heat treating apparatus 203.

As shown in FIG. 9, installed in the chamber 220 of each heat treating apparatus 203 is a stage heater 223 configured to mount the wafer W thereon in a substantially horizontal manner. Further, the heat treating apparatus 203 includes a gas supply unit 226 having a gas supply line 225, for supplying a nonreactive gas such as a nitrogen gas ($N_2$ gas) into the processing space 221 after heating it; and an exhaust unit 228 for evacuating the processing space 221.

The gas supply line 225 is connected to a nitrogen gas supply source 230 and is provided with a flow rate control valve 231 capable of controlling an opening/closing operation of the gas supply line and a feed flow rate of the nitrogen gas.

Since each dry etching apparatus 1 has the same configuration as the dry etching apparatus 1 shown in FIG. 1, description thereof will be omitted here. Further, as in the dry etching apparatus 1 shown in FIG. 1, each component of the dry etching system 200 is connected to and controlled by the process controller 71 having a CPU.

The dry etching system 200 performs dry etching and heat treatment in the different chambers. The second example of the dry etching method in accordance with the second embodiment of the present disclosure is conducted by using the dry etching system 200 having the above-described configuration.

Figure 10:
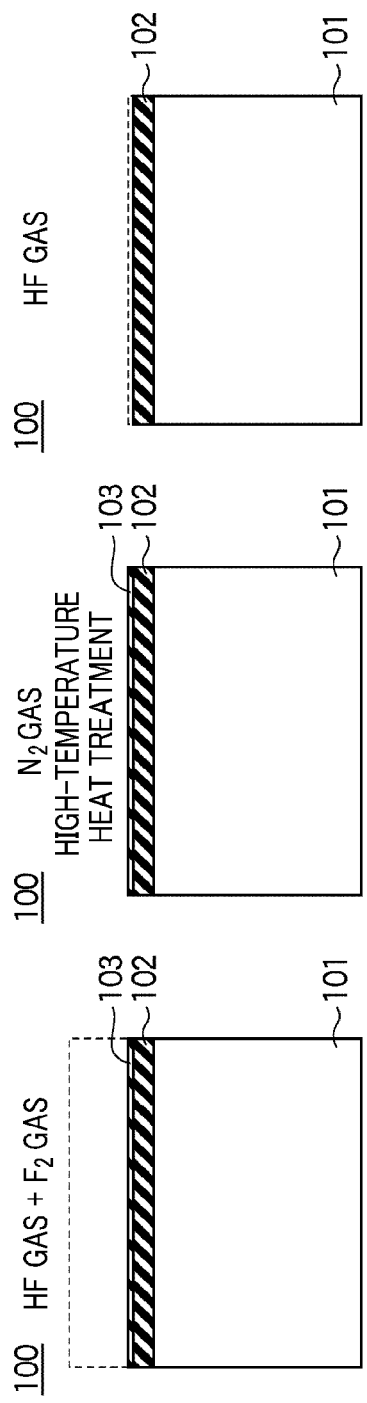
FIGS. 10A to 10C are cross sectional views illustrating the second example of the dry etching method in accordance with the second embodiment of the present disclosure.

FIGS. 10A to 10C are cross sectional views illustrating the second example of the dry etching method in accordance with the second embodiment of the present disclosure.

As illustrated in FIG. 10A, in the second example, dry etching using a processing gas containing at least a hydrogen fluoride gas and a fluorine gas is performed until just-etching or almost just-etching of a silicon nitride film is achieved, as in the first example. This dry etching process is performed within the chamber 2 of the dry etching apparatus 1. As for example dry etching conditions, an internal pressure of the processing space 3 is about 50 Torr; a flow rate ratio (HF/X) between the hydrogen fluoride gas and a gas mixture (X) is about 1500 sccm/1500 sccm; a stage temperature is about 60° C. to about 80° C.; and an etching time is about 140 seconds.

Subsequently, as illustrated in FIG. 10B, the sample 100 is moved into another chamber. In this example, the sample 100 is moved from the chamber 2 into the chamber 220 of the heat treating apparatus 203 so as to remove the processing gas containing at least the hydrogen fluoride gas and the fluorine gas from the vicinity of the sample 100.

Further, the sample 100 is heat-treated after a temperature of the stage (stage heater 223) for mounting the sample 100 thereon in the chamber 220 is set to be a temperature higher than the temperature of the stage 4 during the dry etching in the chamber 2. This step is performed to remove water on the sample 100. As for example heat treatment conditions, an internal pressure of the chamber 220 is about 2 Torr, and a nonreactive gas, e.g., a nitrogen gas is supplied into the chamber 220 at a flow rate of about 2000 sccm. Further, a stage temperature is about 200° C., and a heat treating time is about 120 seconds.

After the heat treatment within the chamber 220, the sample 100 is returned back into the chamber 2.

Thereafter, subsequent overetching is implemented by dry etching using only a hydrogen fluoride gas, as illustrated in FIG. 10C. This overetching process is performed within the chamber 2 of the dry etching apparatus 1. As for example dry etching conditions for the overetching, an internal pressure of the processing space 3 is about 50 Torr; a flow rate of the hydrogen fluoride gas (HF) is about 1600 sccm; a stage temperature is about 60° C. to about 80° C.; and an etching time is about 180 seconds.

In accordance with the above-described second example, the processing gas containing at least the hydrogen fluoride gas and the fluorine gas is removed from the vicinity of the sample 100. Moreover, since the stage temperature for the sample 100 is set to be higher than the stage temperature during the dry etching process, water can be effectively removed from the sample 100. In addition, since a fluorine gas is not used in the overetching, generation of hydrofluoric acid (HF(aq)) can be suppressed.

As discussed above, in accordance with the dry etching method for the silicon nitride film according to the second example of the second embodiment, roughness of the base can be more effectively suppressed as compared to the first example by attempting to remove the water as well as the processing gas containing at least the hydrogen fluoride gas and the fluorine gas.

Third Example

The above-described second example enables more effective suppression of the roughness of the base, as compared to the first example.

However, since the sample (processing target object) is transferred into another chamber to be heat-treated, throughput may be reduced.

Thus, a third example aims at improving the throughput while still suppressing the roughness of the base.

Figure 11:
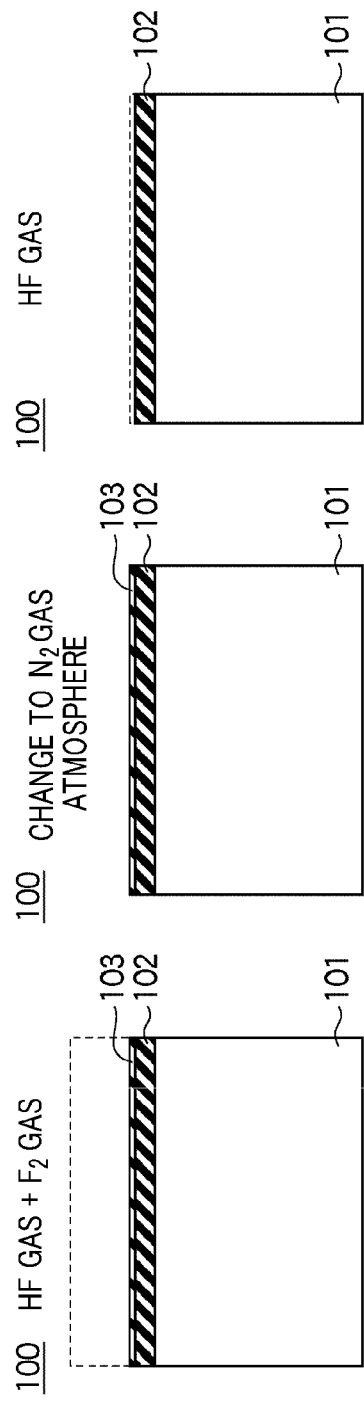
FIGS. 11A to 11C are cross sectional views illustrating a third example of the dry etching method in accordance with the second embodiment of the present disclosure.

FIGS. 11A to 11C are cross sectional views illustrating the third example of the dry etching method in accordance with the second embodiment of the present disclosure.

As illustrated in FIG. 11A, in the third example, dry etching is performed using a processing gas containing at least a hydrogen fluoride gas and a fluorine gas until just-etching or almost just-etching of a silicon nitride film is achieved. As for example dry etching conditions, an internal pressure of the processing space 3 is about 50 Torr; a flow rate ratio HF/X between the hydrogen fluoride gas and a gas mixture (X) is about 1500 sccm/about 1500 sccm; a stage temperature is set to be about 150° C., which is higher than a boiling point of water; and an etching time is about 140 seconds, as in the first and second examples.

Subsequently, as illustrated in FIG. 11B, an atmosphere within the chamber is purged with the nonreactive gas, whereby the atmosphere within the chamber is changed from the processing gas atmosphere containing at least the hydrogen fluoride gas and the fluorine gas to the nonreactive gas atmosphere. By substituting the atmosphere within the chamber with the nonreactive gas, the processing gas containing at least the hydrogen fluoride gas and the fluorine gas is removed from the vicinity of the sample 100. Furthermore, in the third example, it is attempted to remove water from the sample 100 by maintaining the stage temperature higher than the boiling point of water during the purging step. As for example conditions, an internal pressure of the processing space 3 is set to about 2 Torr, and the nonreactive gas, e.g., a nitrogen gas, is supplied into the processing space 3 at a flow rate of about 2000 sccm. Further, a stage temperature is about 150° C., and a heat treating time is about 120 seconds.

Subsequent overetching step is implemented by dry etching using only the hydrogen fluoride gas, as illustrated in FIG. 11C. Example dry etching conditions for this overetching step are as follows. As in the first and second examples, an internal pressure of the processing space 3 is about 50 Torr; a flow rate of the hydrogen fluoride gas (HF) is about 1600 sccm; a stage temperature is about 150° C.; and an etching time is about 180 seconds.

As in the second example, roughness of the base can be more effectively suppressed in the third example as discussed above, as compared to the first example.

Moreover, in the third example, since the sample 100 is processed in a single chamber, throughput can be improved as compared to the second example in which the sample is moved into another chamber to be heat-treated.

Fourth Example

Like the second example, the third example is also advantageous in that the roughness of the base can be more effectively suppressed as compared to the first example. Further, since the sample (processing target object) is not moved to another chamber, a transfer time of the sample (processing target object) can be saved, enabling improvement of throughput. In the third example, a processing temperature is set to be higher than the boiling point of water to suppress stay of water during the dry etching performed until just-etching or almost just-etching of the silicon nitride film is achieved.

However, in the dry etching of the silicon nitride film, using the processing gas containing at least the hydrogen fluoride gas and the fluorine gas, it was proved that an etching rate of the silicon nitride film can be increased if the processing temperature, e.g., the stage temperature is decreased.

Figure 12:
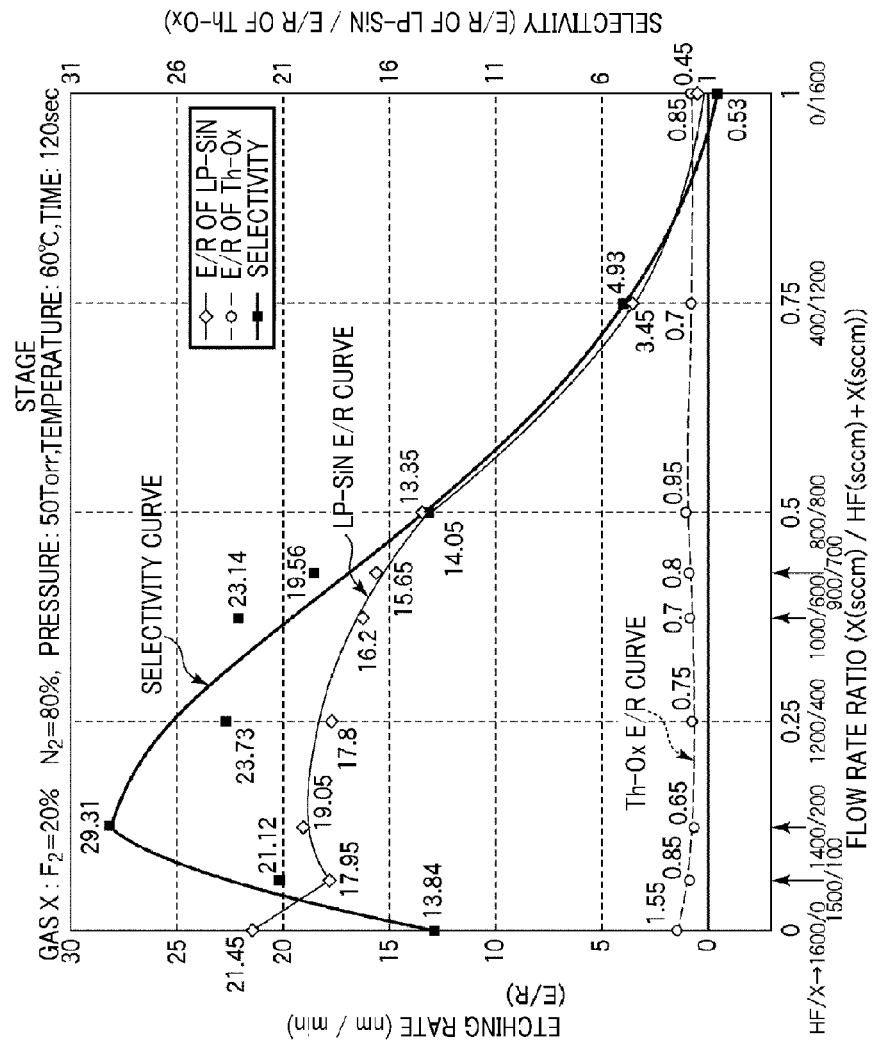
FIG. 12 is a diagram showing a relationship of a flow rate ratio between a hydrogen fluoride gas and a gas mixture (X), i.e., "X/(HF+X) or HF/X", etching rates of a silicon nitride film and a silicon oxide film, and their selectivity.

FIG. 12 is a diagram showing a relationship of a flow rate ratio between a hydrogen fluoride gas and a gas mixture (X), i.e., "X(sccm)/(HF(sccm)+X(sccm)) or HF(sccm)/X(sccm)", etching rates of a silicon nitride film and a silicon oxide film, and their selectivity.

Dry etching conditions for the example shown in FIG. 12 are the same as those for the example shown in FIG. 5 excepting that a stage temperature of the present example is about 60° C.

As shown in FIG. 12, if the stage temperature is decreased from about 150° C. to about 60° C., the etching rate of the silicon nitride film (LP—SiN in the present example) exceeds about 13 nm/min particularly in a flow rate ratio range of "0<X/(HF+X)≤0.5". This high etching rate cannot be obtained when the stage temperature is set to be about 150° C.

Accordingly, by decreasing the stage temperature, the silicon nitride film can be dry-etched more quickly, which is advantages in improving throughput.

Depending on a process, however, it may be required to reduce the etching rate to, e.g., about 8 to about 12 nm/min. A user may appropriately select whether to increase or decrease the stage temperature.

(Optimization of Etching Rate of Silicon Nitride Film)

Figure 13:
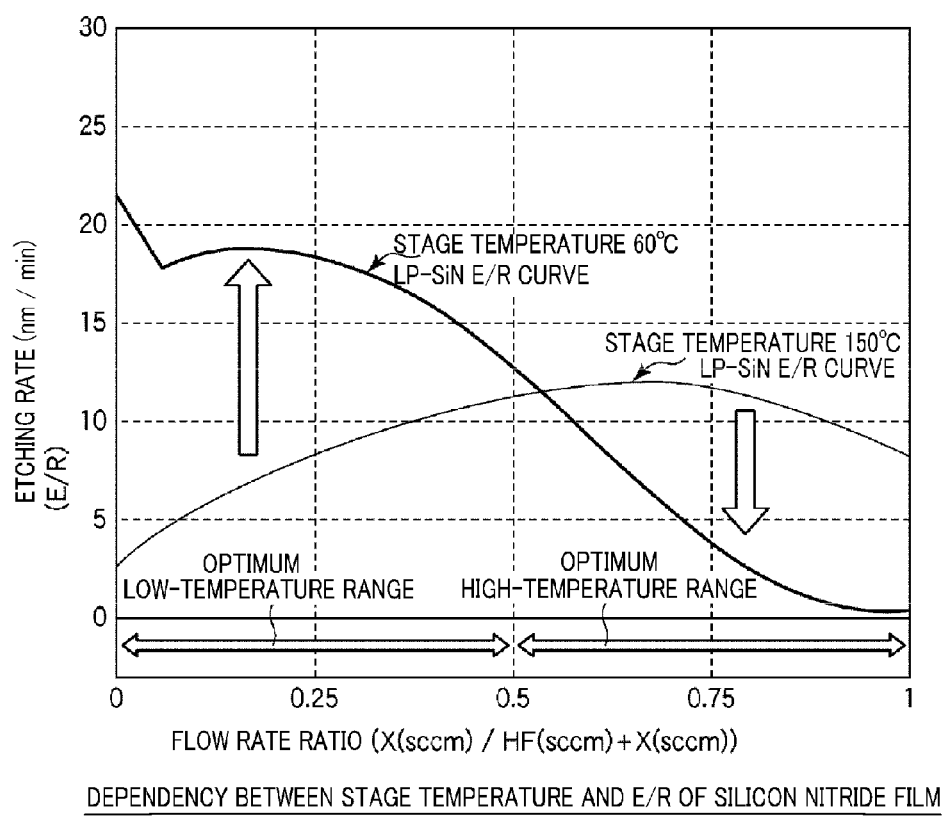
FIG. 13 shows a dependency between a stage temperature and an etching rate of a silicon nitride film.

FIG. 13 shows a dependency between a stage temperature and an etching rate of a silicon nitride film.

FIG. 13 shows an etching rate (E/R) curve of the silicon nitride film (LP—SiN) when the stage temperature is about 60° C. (below, referred to as a low temperature range) and an E/R curve of the silicon nitride film (LP—SiN) when the stage temperature is about 150° C. (below, referred to as a high temperature range). These E/R curves are extracted from the E/R curves of the silicon nitride film as shown in FIG. 5 and FIG. 12.

As shown in FIG. 13, in the low temperature range, the etching rate tends to be high in the flow rate ratio range of "0<X/(HF+X)≤0.5", whereas it tends to be low in a flow rate ratio range of "0.5<X/(HF+X)≤1". On the contrary, in the high temperature range, the etching rate tends to be low in the flow rate ratio range of "0<X/(HF+X)≤0.5", whereas it tends to be high in the flow rate ratio range of "0.5<X/(HF+X)≤1".

In the present disclosure, the low-temperature range refers to a stage temperature of about 60° C.±45° C., while a high-temperature range indicates a stage temperature of about 150° C.±45° C. Here, ±45° C. is derived from the half of a difference between 60° C. and 150° C., and, in the present example, a temperature corresponding to the center value between 60° C. and 150° C. is 105° C.

To elaborate, when the stage temperature ranges from about 15° C. to about 105° C., the etching rate of the silicon nitride film can be increased by setting the flow rate ratio to be in the range of 0<X/(HF+X)≤0.5".

Moreover, when the stage temperature ranges from about 105° C. to about 195° C., the etching rate of the silicon nitride film can be increased by setting the flow rate ratio to be in the range of 0.5<X/(HF+X)≤1".

If the stage temperature and the flow rate ratio "X/(HF+X)" are controlled as stated above, the etching rate of the silicon nitride film can be controlled in a wide range of about 8 to 20 nm/min.

(Optimization of Etching Rate of Silicon Oxide Film)

In the dry etching for the silicon nitride film, using the processing gas containing at least the hydrogen fluoride gas and the fluorine gas, the silicon oxide film may be used as the etching stopper. In such a case, it is desirable that the etching rate of the silicon oxide film is low.

Figure 14:
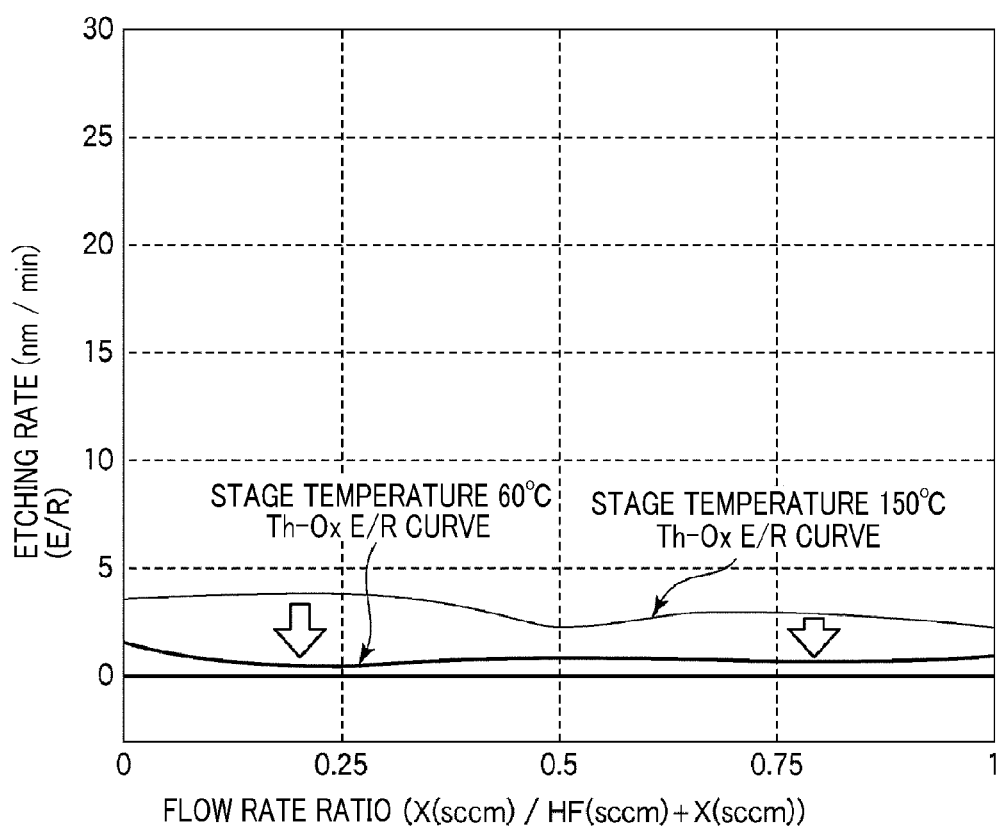
FIG. 14 shows a dependency between a stage temperature and an etching rate of the silicon oxide film.

FIG. 14 shows a dependency between a stage temperature and an etching rate of the silicon oxide film.

FIG. 14 show an E/R curve of the silicon oxide film (Th-Ox) when the stage temperature is in the low temperature range and an E/R curve of the silicon oxide film (Th-Ox) when the stage temperature is in the high temperature range. These E/R curves are extracted from the E/R curves of the silicon oxide film as shown in FIG. 5 and FIG. 12.

As can be seen from FIG. 14, the etching rate of the silicon oxide film tends to be low in the low temperature range, independently of the flow rate ratio "X/(HF+X)".

Accordingly, when the silicon oxide film is used as the etching stopper in the dry etching of the silicon nitride film using the processing gas containing at least the hydrogen fluoride gas and the fluorine gas, it may be desirable to set the stage temperature to be in the range of about 15° C. to 105° C.

(Optimization of Selectivity)

When the silicon oxide film is used as the etching stopper in the dry etching of the silicon nitride film using the processing gas containing at least the hydrogen fluoride gas and the fluorine gas, it is desirable that selectivity, i.e., "an etching rate of LP—SiN/an etching rate of Th-Ox" is high. Further, since the silicon oxide film is used as the etching stopper, the stage temperature is desirably set to be in the range of about 15° C. to 105° C. as discussed above.

Figure 15:
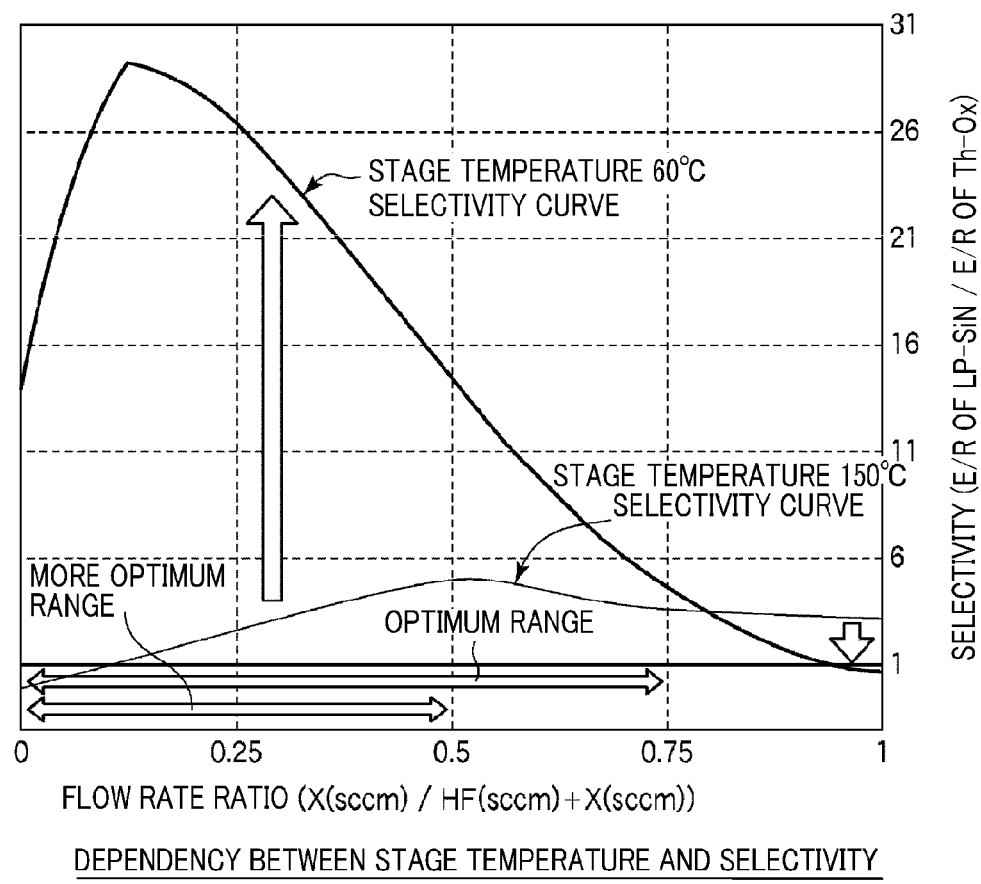
FIG. 15 shows a dependency between a stage temperature and selectivity.

FIG. 15 shows a dependency between a stage temperature and selectivity.

FIG. 15 provides a selectivity curve when the stage temperature is in the low temperature range and a selectivity curve when the stage temperature is in the high temperature range. These selectivity curves are extracted from the selectivity curves as shown in FIGS. 5 and 12.

As can be seen from FIG. 15, in the low temperature range, the selectivity tends to be high in a flow rate ratio range of "0<X/(HF+X)≤0.75", whereas it tends to be low in a flow rate ratio range of "0.75<X/(HF+X)≤1".

Accordingly, when the stage temperature ranges from about 15° C. to 105° C., high selectivity can be obtained by setting the flow rate ratio "X/(HF+X)" to be in the range of about 0 to 0.75.

Especially, if the flow rate ratio "X/(HF+X)" is set to be in the range of about 0 to 0.5, higher selectivity equal to or higher than 13 can be achieved.

(Optimization of Stage Temperature)

When the silicon oxide film is used as the etching stopper in the dry etching of the silicon nitride film using the processing gas containing at least the hydrogen fluoride gas and the fluorine gas, it may be desirable to set the stage temperature to be in the low temperature range, i.e., about 15° C. to 105° C. in the present disclosure, as discussed earlier.

Now, an optimum temperature, when the stage temperature is in the low temperature range, will be discussed.

Figure 16:
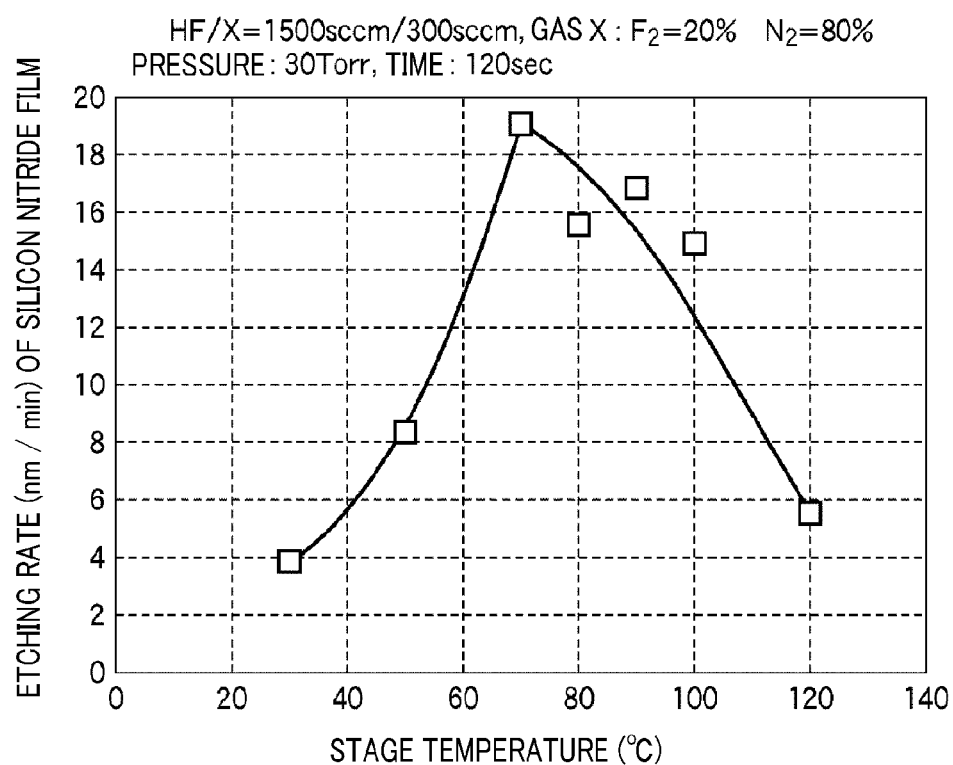
FIG. 16 presents a diagram showing a relationship between a stage temperature and an etching rate of a silicon nitride film.

FIG. 16 shows a relationship between an etching rate and a stage temperature.

As can be seen from FIG. 16, the etching rate of the silicon nitride film is highest when the stage temperature is in the range of about 60° C. to about 80° C.

Figure 17:
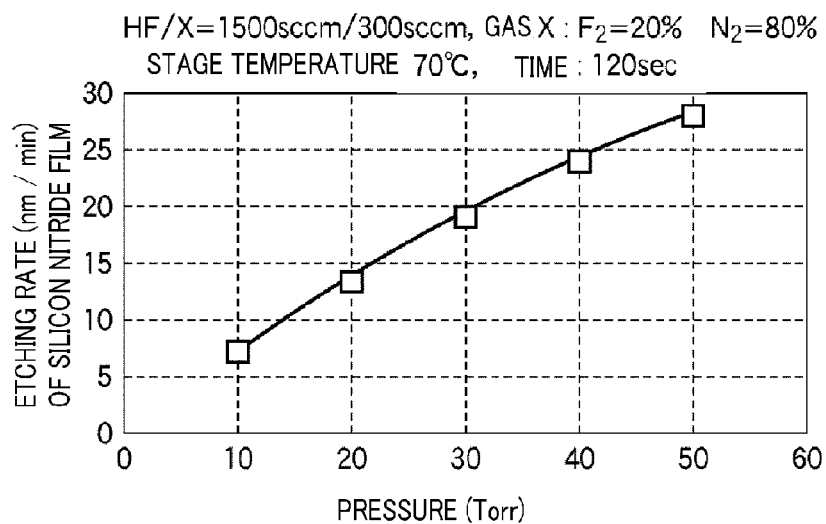
FIG. 17 is a diagram showing a relationship between a pressure and an etching rate of a silicon nitride film.

The etching rate of the silicon nitride film has a pressure dependency, and, as indicated in FIG. 17, it increases with the rise of the pressure.

Figure 18:
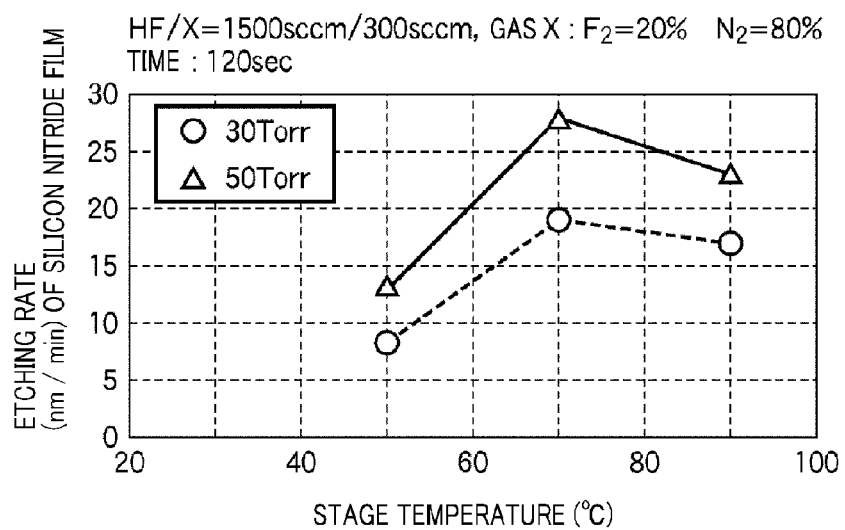
FIG. 18 is a diagram showing a relationship between a stage temperature and an etching rate of a silicon nitride film.

Furthermore, as shown in FIG. 18, the etching rate of the silicon nitride film is maintained dependent on a pressure even in the stage temperature range of about 60° C. to about 80° C.

Figure 19:
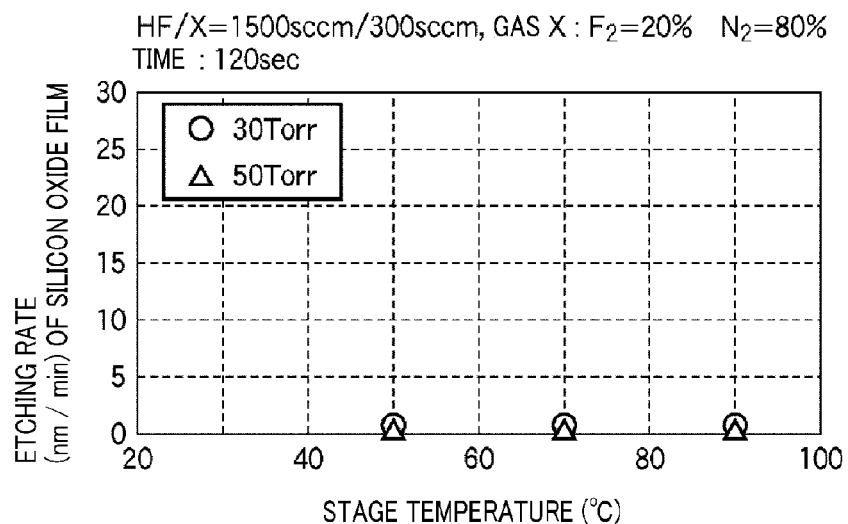
FIG. 19 is a diagram showing a relationship between a stage temperature and an etching rate of a silicon oxide film.
Figure 20:
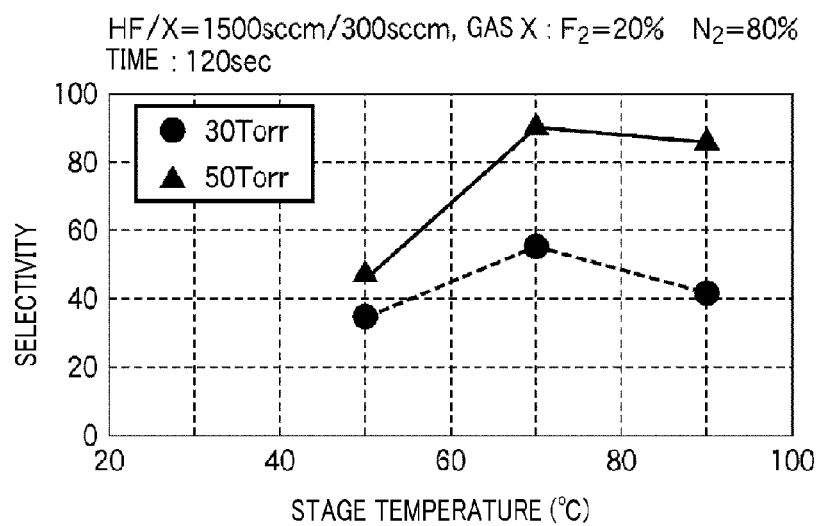
FIG. 20 is a diagram showing a relationship between a stage temperature and selectivity.

In addition, the etching rate of the silicon oxide film is almost zero in the stage temperature range of about 60° C. to about 80° C., as shown in FIG. 19. Further, in the present example, the silicon oxide film is HDP-Ox. Accordingly, as shown in FIG. 20, the selectivity of the silicon nitride film against the silicon oxide film is highest in the stage temperature range of about 60° C. to about 80° C.

Accordingly, in the dry etching using the processing gas containing at least the hydrogen fluoride gas and the fluorine gas, the stage temperature range of about 60° C. to about 80° C. is desirable.

However, the stage temperature of about 60° C. to about 80° C. is lower than a boiling point of water. In such a temperature range, roughness of the base may be caused as discussed in the second and third examples of the second embodiment of the present disclosure.

Therefore, a fourth example aims at further improving throughput while suppressing roughness of the base and suppressing reduction of the etching rate of the silicon nitride film.

FIGS. 21A to 21C are cross sectional views illustrating the fourth example of the dry etching method in accordance with the second embodiment of the present disclosure.

As shown in FIG. 21A, in the fourth example, dry etching is performed using a processing gas containing at least a hydrogen fluoride gas and a fluorine gas until just-etching or almost just-etching of a silicon nitride film is achieved.

Figure 22:
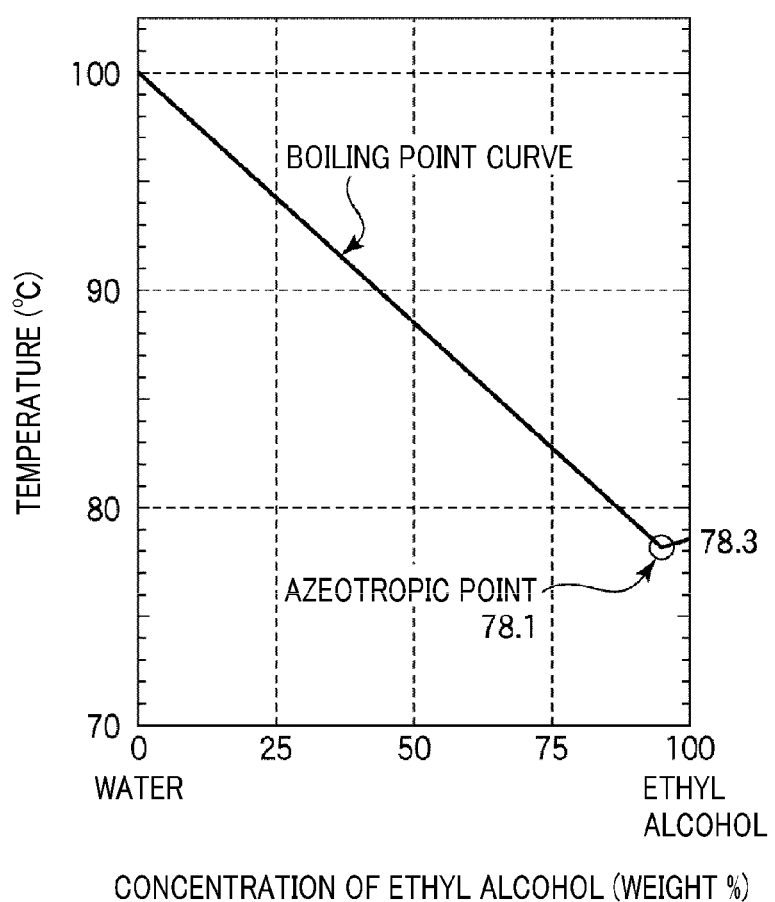
FIG. 22 is a diagram indicating a relationship between a boiling point of water and a concentration of ethyl alcohol.

Further, in the fourth example, a material that lowers the boiling point of water is additionally supplied into the chamber together with the processing gas. For example, such a material may be ethyl alcohol gas, as illustrated in FIG. 22. As can be seen from FIG. 22, the boiling point of water containing ethyl alcohol is lowered to less than 100° C. By using this, stay of water on the sample 100 can be still suppressed as in the first and second examples even when the dry etching is performed at a processing temperature, e.g., about 80° C., less than the typical boiling point (100° C.) of water. Example conditions for the dry etching are the same as those in the first and second examples. That is, an internal pressure of the processing space 3 is about 50 Torr; a flow rate ratio HF/X between the hydrogen fluoride gas and the gas mixture (X) is about 1500 sccm/1500 sccm; a stage temperature is about 80° C.; and an etching time is about 140 seconds.

Subsequently, as shown in FIG. 21B, an atmosphere within the chamber is purged with a nonreactive gas and an ethyl alcohol gas, as in the third example, whereby the atmosphere within the chamber is changed to the atmosphere of the nonreactive gas and the ethyl alcohol gas. By changing the atmosphere within the chamber to the atmosphere of the nonreactive gas and the ethyl alcohol gas, the processing gas containing at least the hydrogen fluoride gas and the fluorine gas is removed from the sample 100. As for example processing conditions, the nonreactive gas, e.g., a nitrogen gas and the ethyl alcohol gas are supplied into the processing space 3 at flow rates of about 2000 sccm and about 1000 sccm, respectively. Further, a stage temperature is about 80° C., and a heat treating time is about 120 seconds.

Subsequent overetching is performed by dry etching using only the hydrogen fluoride gas, as illustrated in FIG. 21C. Example dry etching conditions for this overetching step are as follows. As in the first and third examples, an internal pressure of the processing space 3 is about 50 Torr; a flow rate of the hydrogen fluoride gas (HF) is about 1600 sccm; a stage temperature is about 60° C. to about 80° C.; and an etching time is about 180 seconds.

According to this fourth example, by adding the material for lowering the boiling point of the water into the processing gas, water can be efficiently removed from the sample 100 even when the dry etching is performed at a temperature lower than the boiling point of the water.

Accordingly, as compared to the third example, the stage temperature can be lowered to an optimal temperature, i.e., about 60° C. to about 80° C. during the dry etching using the processing gas containing at least the hydrogen fluoride gas and the fluorine gas, and throughput can be improved.

In the above, although the dry etching method for the silicon nitride film has been described in accordance with the embodiments of the present disclosure, the present invention is not limited thereto but can be modified in various ways.

For example, in the description of the first and second embodiments, although the dry etching method for the silicon nitride film has been applied to the semiconductor wafer used in the manufacture of a semiconductor integrated circuit as a processing target object, the processing target object is not limited to the semiconductor wafer. The present invention can also be appropriately applied to a glass substrate used in the manufacture of a flat panel display or a solar cell.

What is claimed is:

1. A dry etching method for dry-etching a silicon nitride film formed on a silicon oxide film not containing phosphorous, the method comprising:
    a first process of dry-etching the silicon nitride film without generating plasma by supplying a processing gas, which contains at least a hydrogen fluoride gas and a fluorine gas, into a chamber until about half-etching or more of the silicon nitride film is achieved;
    after the first process, a process of heat-treating a processing target object including the silicon oxide film and the silicon nitride film by setting a temperature of a stage, on which the processing target object is mounted, to be higher than a temperature of the stage in the first process; and
    after the process of heat-treating, a second process of over-etching all of the silicon nitride film remaining in the first process without generating plasma by changing an atmosphere within the chamber to an atmosphere of a processing gas containing only a hydrogen fluoride gas.

2. The dry etching method of claim 1, wherein a material that lowers a boiling point of water is added to the processing gas containing at least the hydrogen fluoride gas and the fluorine gas.

3. The dry etching method of claim 1, wherein a chamber in which the heat treatment is performed is different from the chamber in which the dry etching is performed in the first process and the second process.

4. The dry etching method of claim 3, wherein a material that lowers a boiling point of water is added to the processing gas containing at least the hydrogen fluoride gas and the fluorine gas.

5. A dry etching method for dry-etching a silicon nitride film formed on a silicon oxide film not containing phosphorous, the method comprising:
    a first process of dry-etching the silicon nitride film without generating plasma by supplying a processing gas, which contains at least a hydrogen fluoride gas and a fluorine gas, into a chamber until about half-etching or more of the silicon nitride film is achieved;
    after the first process, a process of changing an atmosphere within the chamber to an atmosphere of a nonreactive gas; and
    after the process of changing the atmosphere, a second process of over-etching all of the silicon nitride film remaining in the first process without generating plasma by changing an atmosphere within the chamber to an atmosphere of a processing gas containing only a hydrogen fluoride gas.

6. The dry etching method of claim 5, wherein in the process of changing the atmosphere within the chamber to the atmosphere of the nonreactive gas, a material that lowers a boiling point of water is added to the nonreactive gas.

7. The dry etching method of claim 5, wherein a material that lowers a boiling point of water is added to the processing gas containing at least the hydrogen fluoride gas and the fluorine gas.

8. A dry etching method for dry-etching a silicon nitride film formed on a silicon oxide film not containing phosphorous, the method comprising:
    a first process of dry-etching the silicon nitride film without generating plasma by supplying a processing gas, which contains at least a hydrogen fluoride gas and a fluorine gas, into a chamber until about half-etching or more of the silicon nitride film is achieved; and
    after the first process, a second process of over-etching all of the silicon nitride film remaining in the first process without generating plasma by changing an atmosphere within the chamber to an atmosphere of a processing gas containing only a hydrogen fluoride gas,
    wherein a material that lowers a boiling point of water is added to the processing gas containing at least the hydrogen fluoride gas and the fluorine gas.

* * * * *

UNITED STATES PATENT AND TRADEMARK OFFICE
CERTIFICATE OF CORRECTION

PATENT NO. : 8,679,985 B2  
APPLICATION NO. : 12/698403  
DATED : March 25, 2014  
INVENTOR(S) : Eiichi Nishimura Page 1 of 1

It is certified that error appears in the above-identified patent and that said Letters Patent is hereby corrected as shown below:

In the specification, column 3, line 55-56 please replace - main body includes - with "main body 21 includes"

Signed and Sealed this  
First Day of July, 2014

Michelle K. Lee  
*Deputy Director of the United States Patent and Trademark Office*